(12) United States Patent
Lee et al.

(10) Patent No.: US 9,384,805 B1
(45) Date of Patent: Jul. 5, 2016

(54) SEMICONDUCTOR MEMORY DEVICE, SEMICONDUCTOR SYSTEM AND TEST METHOD THEREOF

(71) Applicant: SK hynix Inc., Gyeonggi-do (KR)

(72) Inventors: Sung-Yub Lee, Gyeonggi-do (KR); Sung-Soo Chi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/743,391

(22) Filed: Jun. 18, 2015

(30) Foreign Application Priority Data

Feb. 16, 2015 (KR) ........................ 10-2015-0023173

(51) Int. Cl.
| | |
|---|---|
| G11C 7/00 | (2006.01) |
| G11C 7/22 | (2006.01) |
| G11C 7/12 | (2006.01) |
| G11C 8/08 | (2006.01) |
| G11C 29/08 | (2006.01) |

(52) U.S. Cl.
CPC .. *G11C 7/22* (2013.01); *G11C 7/12* (2013.01); *G11C 8/08* (2013.01); *G11C 29/08* (2013.01)

(58) Field of Classification Search
USPC .......................................................... 365/203
See application file for complete search history.

(56) References Cited

U.S. PATENT DOCUMENTS

| | | | | |
|---|---|---|---|---|
| 2001/0017813 | A1* | 8/2001 | Uchida | ................... G11C 5/06 365/230.06 |
| 2003/0191974 | A1* | 10/2003 | Kato | ....................... G11C 7/12 713/300 |

FOREIGN PATENT DOCUMENTS

KR  1020020089990  11/2002

* cited by examiner

*Primary Examiner* — Anthan Tran
(74) *Attorney, Agent, or Firm* — IP & T Group LLP

(57) ABSTRACT

A semiconductor memory device may include a control signal generation unit suitable for generating a block selection signal in response to first and second precharge signals during a test operation; a word line control unit suitable for generating a word line deactivation signal in response to the first precharge signal and the block selection signal; and a bit line equalization control unit suitable for generating a bit line level equalization signal in response to the second precharge signal and the block selection signal.

19 Claims, 7 Drawing Sheets

SEMICONDUCTOR MEMORY DEVICE, SEMICONDUCTOR SYSTEM AND TEST METHOD THEREOF

CROSS-REFERENCE TO RELATED APPLICATIONS

The present application claims priority of Korean Patent Application No. 10-2015-0023173, filed on Feb. 16, 2015, which is incorporated herein by reference in its entirety.

BACKGROUND

1. Field

Exemplary embodiments of the present invention relate to a semiconductor design technology and, more particularly, to a semiconductor memory device, a semiconductor system including the same and a test method thereof.

2. Description of the Related Art

A semiconductor memory device includes a plurality of memory cells, and word lines and bit lines in order to read and write data to and from the memory cells. The word lines are driven in response to an active command and a plurality of row addresses. To this end, semiconductor memory devices may further include a control unit for controlling the word lines.

A bit line level equalization signal for precharging the bit lines is activated after the word line is disabled in response to a word line deactivation signal. Word lines are typically used for about 10 years, but word line response time degrades over time as the word lines wear out. Therefore, although the bit line level equalization signal has been designed to activate after the word line is completely disabled, the timing of when the word line is disabled may overlap when the bit line level equalization signal is activated.

FIG. 1 is a waveform diagram illustrating an operation of a conventional semiconductor memory device.

Referring to FIG. 1, a plurality of sub-word lines SWL0 to SWLn may be activated in response to an active command ACT, and then a write operation may be performed in response to a write command WT. After the write operation ends, a bit line level equalization signal BLEQ for precharging bit lines BL may be activated in response to a precharging command PCG. Among the sub-word lines SWL0 to SWLn, it is assumed that the first sub-word line SWL0 may be a non-degraded word line and the second sub-word line SWLn may be a degraded word line as compared with the first sub-word line SWL0. That is, since the second sub-word line SWLn has deteriorated with usage, the slope (i.e. response time) of the second sub-word line SWLn has been reduced.

After the write operation is performed in response to the write command WT, the first sub-word line SWL0 is deactivated in response to a word line deactivation signal (not illustrated) and the bit line level equalization signal BLEQ is activated, so that a precharge operation may be properly performed. However, the timing of when a degraded second sub-word line SWLn is deactivated may overlap when the bit line level equalization signal BLEQ is activated. Therefore, the precharge operation may not be performed properly.

SUMMARY

Various embodiments are directed to a semiconductor memory device that performs a test operation for checking a margin between a word line deactivation signal and a bit line level equalization signal, a semiconductor system including the same, and a test method thereof.

In an embodiment, a semiconductor memory device may include: a control signal generation unit suitable for generating a block selection signal in response to first and second precharge signals during a test operation; a word line control unit suitable for generating a word line deactivation signal in response to the first precharge signal and the block selection signal; and a bit line equalization control unit suitable for generating a bit line level equalization signal in response to the second precharge signal and the block selection signal.

During the test operation, the bit line level equalization signal may be initially set to be activated earlier than when the word line deactivation signal is activated.

The control signal generation unit may include: a signal combination section suitable for generating a control signal for controlling the block selection signal by combining the first precharge signal with the second precharge signal during the test operation; and a block selection signal generation section suitable for generating the block selection signal in response to the control signal and a bank selection signal.

The semiconductor memory device may further include: a first precharge signal generation section suitable for generating the first precharge signal in response to a bank command signal and a first duration signal during the test operation; and a second precharge signal generation section suitable for generating the second precharge signal in response to the bank command signal and a second duration signal during the test operation.

The first duration signal may indicate a minimum time required to write data in a memory cell coupled to a word line.

The second duration signal may indicate a minimum time required to precharge a bit line.

An activation duration of the first precharge signal may be longer than an activation duration of the second precharge signal.

The semiconductor memory device may further include: a memory core unit suitable for performing a precharge operation in response to the bit line level equalization signal, and outputting data information on data pass/fail occurring in the precharge operation; and a signal adjustment unit suitable for generating an adjustment control signal based on the data information during the test operation, wherein the second precharge signal generation section adjusts an activation duration of the second precharge signal in response to the adjustment control signal.

The activation duration of the second precharge signal may be adjusted until the bit line level equalization signal is activated later than when the word line deactivation signal is activated.

In another embodiment, a semiconductor memory device may include: a precharge signal generation unit suitable for generating first and second precharge signals having different activation durations in response to a bank command signal; a control signal generation unit suitable for generating a block selection signal in response to the first and second precharge signals during a test operation; a word line control unit suitable for generating a word line deactivation signal in response to the first precharge signal and the block selection signal; and a bit line equalization control unit suitable for generating a bit line level equalization signal in response to the second precharge signal and the block selection signal.

During the test operation, the bit line level equalization signal may be initially set to be activated earlier than when the word line deactivation signal is activated.

The control signal generation unit may include: a signal combination section suitable for generating a control signal for controlling the block selection signal by combining the first precharge signal with the second precharge signal during the test operation; and a block selection signal generation section suitable for generating the block selection signal in response to the control signal and a bank selection signal.

The precharge signal generation unit may include: a first precharge signal generation section suitable for generating the first precharge signal in response to the bank command signal and a first duration signal during the test operation; and a second precharge signal generation section suitable for generating the second precharge signal in response to the bank command signal and a second duration signal during the test operation.

The first duration signal may indicate a minimum time required to write data in a memory cell coupled to a word line.

The second duration signal may indicate a minimum time required to precharge a bit line.

An activation duration of the first precharge signal may be longer than the activation duration of the second precharge signal.

The semiconductor memory device may further include: a memory core unit suitable for performing a precharge operation in response to the bit line level equalization signal, and outputting data information on data pass/fail occurring in the precharge operation; and a signal adjustment unit suitable for generating an adjustment control signal based on the data information during the test operation, wherein the precharge signal generation unit adjusts the activation duration of the second precharge signal in response to the adjustment control signal.

The activation duration of the second precharge signal may be adjusted until the bit line level equalization signal is activated later than when the word line deactivation signal is activated.

In another embodiment, a semiconductor system may include: a memory device including a plurality of sub-word lines, suitable for detecting degradation information on the plurality of sub-word lines; and a memory controller suitable for outputting a bit line level equalization control signal based on the degradation information on the plurality of sub-word lines, wherein the memory device performs a precharge operation in response to a bit line level equalization signal whose activation timing is adjusted in response to the bit line level equalization control signal.

The memory device may include: a word line information detection unit suitable for detecting the degradation information on the plurality of sub-word lines; and a memory unit suitable for performing the precharge operation in response to the bit line level equalization signal.

In another embodiment, a test method of a semiconductor memory device may include: generating a block selection signal in response to first and second precharge signals that have different activation durations and a bank selection signal; generating a bit line level equalization signal in response to the second precharge signal and the block selection signal; generating a word line deactivation signal in response to the first precharge signal and the block selection signal; performing a precharge operation in response to the bit line level equalization signal; and repeating the generating of the block selection signal, the generating of the bit line level equalization signal, the generating of the word line deactivation signal, and the performing of the precharge operation until the bit line level equalization signal is activated later than when the word line deactivation signal is activated by adjusting when the bit line level equalization signal is activated.

In accordance with a semiconductor memory device according to the present invention, a margin between a word line deactivation signal and a bit line level equalization signal is ensured through a test operation and a sufficient margin is ensured during operations so that it is possible to safely protect data stored in cells.

DETAILED DESCRIPTION

Figure 1:
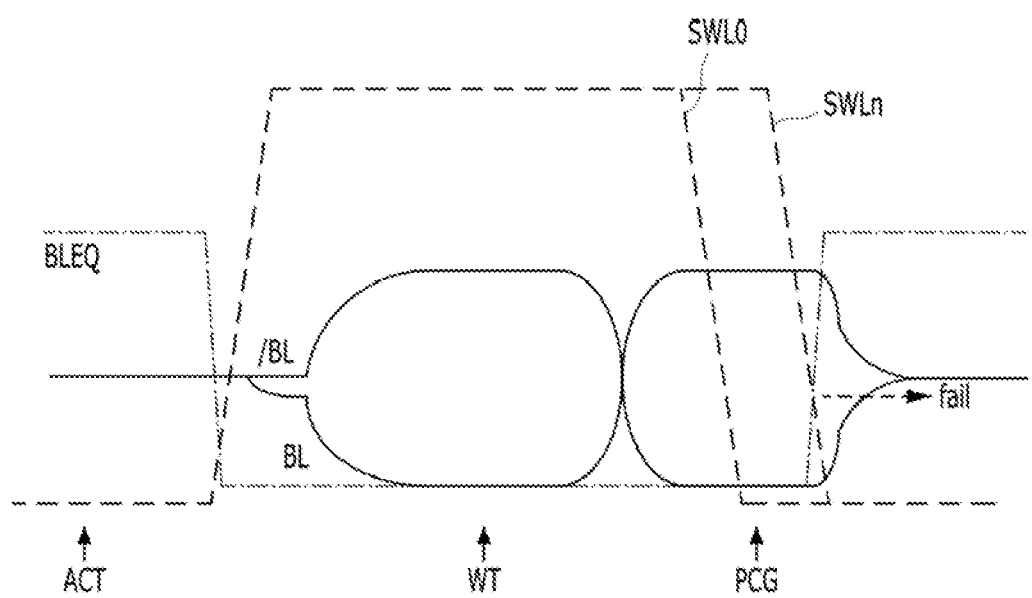
FIG. 1 is a waveform diagram illustrating an operation of a conventional semiconductor memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is also noted that in this specification, "connected/coupled" refers to one component not only directly coupling another component but also indirectly coupling another component through an intermediate component. In addition, a singular form may include a plural form as long as it is not specifically mentioned.

Figure 2:
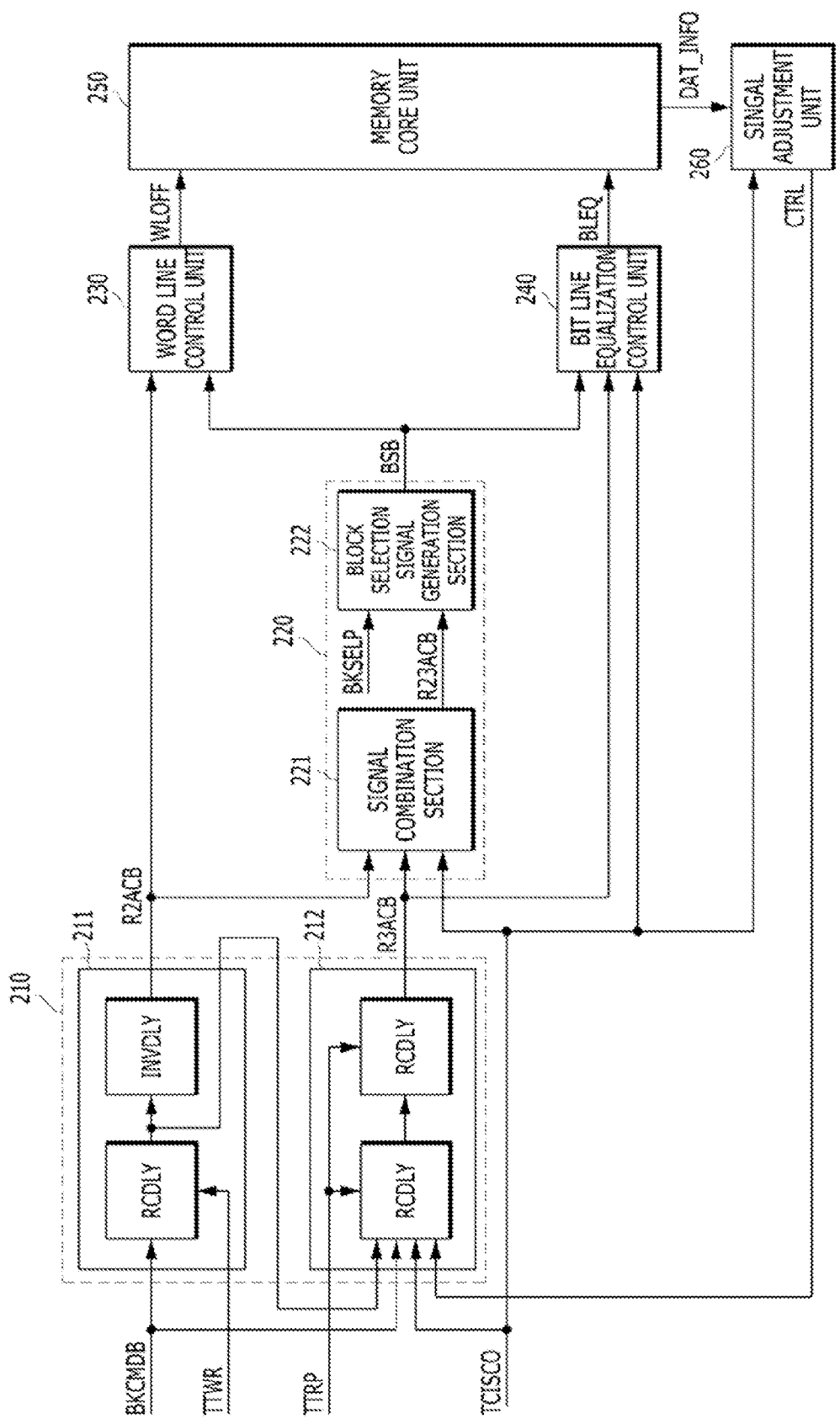
FIG. 2 is a block diagram illustrating a semiconductor memory device in accordance with an embodiment of the present invention.

FIG. 2 is a block diagram illustrating a semiconductor memory device in accordance with an embodiment of the present invention.

Referring to FIG. 2, the semiconductor memory device may include a precharge signal generation unit 210, a control signal generation unit 220, a word line control unit 230, a bit line equalization control unit 240, a memory core unit 250, and a signal adjustment unit 260.

The precharge signal generation unit 210 may include a first precharge signal generation section 211 and a second precharge signal generation section 212.

The first precharge signal generation section 211 may include an RC delay circuit RCDLY and an inverter delay circuit INVDLY, which internally delay a bank command signal BKCMDB by a first delay amount in response to a first duration signal TTWR, thereby generating a first precharge signal R2ACB. The bank command signal BKCMDB may indicate an active signal and the first duration signal TTWR may indicate a minimum time required to write data in a memory cell coupled to a word line. The first precharge signal R2ACB may be used to control the word line.

The second precharge signal generation section 212 may include a plurality of RC delay circuits RCDLY, which internally delay the bank command signal BKCMDB by a second delay amount in response to a second duration signal TTRP and a test signal TCISCO, thereby generating a second precharge signal R3ACB. The second duration signal TTRP may indicate a minimum time required to precharge bit lines. The test signal TCISCO is activated during a test operation for ensuring a margin between a word line deactivation signal WLOFF and a bit line level equalization signal BLEQ. The first delay amount is greater than the second delay amount so that an activation duration of the first precharge signal R2ACB is longer than an activation duration of the second precharge signal R3ACB.

The control signal generation unit 220 may include a signal combination section 221 and a block selection signal generation section 222.

The signal combination section 221 may generate a control signal R23ACB in response to the first precharge signal R2ACB and the second precharge signal R3ACB when the test signal TCISCO is activated. The control signal R23ACB is generated by adding the first precharge signal R2ACB to the second precharge signal R3ACB, and an activation duration of the control signal R23ACB may be set in response to the first precharge signal R2ACB or the second precharge signal R3ACB.

The block selection signal generation section 222 may generate a block selection signal BSB in response to the control signal R23ACB and a bank selection signal BKSELP. The block selection signal BSB is used to select a block including a group of memory cells, and includes cell mat information. Furthermore, since the block selection signal BSB is generated in response to the control signal R23ACB, an activation duration of the block selection signal BSB may be longer than that of a block selection signal of a semiconductor memory device in accordance with a comparative example. The block selection signal BSB may be used to control the word line deactivation signal WLOFF.

The word line control unit 230 may generate the word line deactivation signal WLOFF to control a deactivation of a word line corresponding to the cell mat information included in the block selection signal BSB. During the test operation, the word line deactivation signal WLOFF may be delayed and activated by the activation duration of the first precharge signal R2ACB in response to the block selection signal BSB.

The bit line equalization control unit 240 may generate the bit line level equalization signal BLEQ in response to the test signal TCISCO and the second precharge signal R3ACB. During the test operation, the time when the bit line level equalization signal BLEQ is activated may be initially set to be earlier than when the word line deactivation signal WLOFF is activated. The time when the word line deactivation signal WLOFF is activated may be independently controlled by generating the control signal R23ACB by adding the first precharge signal R2ACB to the second precharge signal R3ACB, and the bit line level equalization signal BLEQ may be activated in response to the second precharge signal R3ACB.

The memory core unit 250 may perform the precharge operation in response to the bit line level equalization signal BLEQ. Although not illustrated in the drawings, the memory core unit 250 may include a memory cell array, a precharge section, and a sense amplification section, and may perform a data precharge and read operation through these elements. During the test operation, the memory core unit 250 performs the precharge operation in response to the bit line level equalization signal BLEQ. However, since the bit line level equalization signal BLEQ is initially set to activate earlier than when the word line deactivation signal WLOFF is activated, a bit line pair is precharged before a word line is deactivated, so that written cell data may be lost, i.e., a data failure may occur. Accordingly, the memory core unit 250 may output information on pass/fail of data, that is, data information DAT_INFO, to the signal adjustment unit 260 after performing the precharge operation in response to the bit line level equalization signal BLEQ.

The signal adjustment unit 260 may generate an adjustment control signal CTRL for adjusting the activation duration of the second precharge signal R3ACB in response to the test signal TCISCO and the data information DAT_INFO outputted from the memory core unit 250.

Then, the second precharge signal generation section 212 may adjust the activation duration of the second precharge signal R3ACB in response to the adjustment control signal CTRL, and then output the second precharge signal R3ACB.

In brief, the semiconductor memory device may adjust when the bit line level equalization signal BLEQ is activated by repeatedly performing the test operation until the bit line level equalization signal BLEQ is activated later than when the word line deactivation signal WLOFF is activated, thereby determining the optimal timing so that data failures do not occur. Consequently, it is possible to sufficiently ensure a margin between the word line deactivation signal WLOFF and the bit line level equalization signal BLEQ, thereby preventing data failures from occurring during normal operations.

Figure 3:
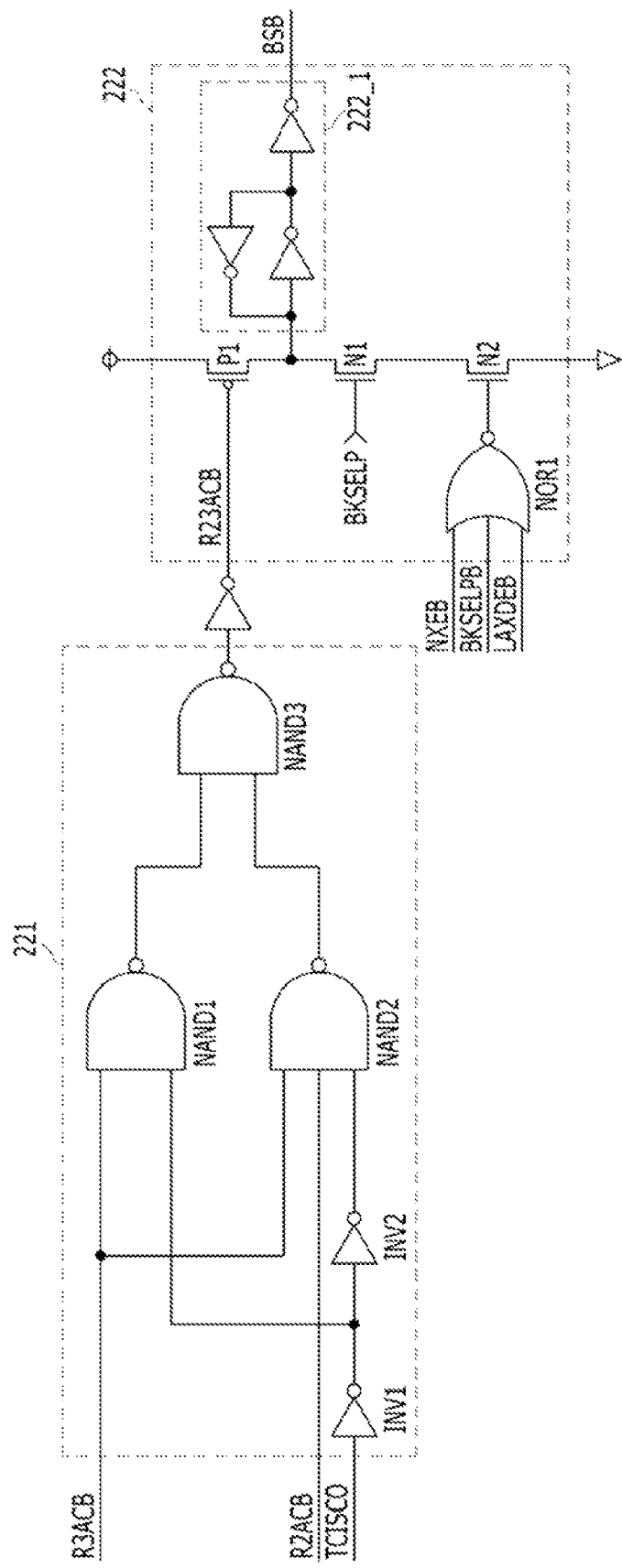
FIG. 3 is a circuit diagram illustrating a control signal generation unit illustrated in FIG. 2.

FIG. 3 is a circuit diagram illustrating the control signal generation unit 220 illustrated in FIG. 2.

Referring to FIG. 2 and FIG. 3, the control signal generation unit 220 may include the signal combination section 221 and the block selection signal generation section 222.

The signal combination section 221 may be configured by a combination of logic circuits including a plurality of NAND gates NAND1 to NAND3 and a plurality of inverters INV1 and INV2. When the test signal TCISCO is activated, the signal combination section 221 may generate the control signal R23ACB by logically combining the first precharge signal R2ACB with the second precharge signal R3ACB.

The block selection signal generation section 222 may include driving parts P1, N1, and N2 and a latch circuit 222_1.

Among the driving parts P1, N1, and N2, a pull-up driving part P1 may be configured by a PMOS transistor and may be pull-up driven in response to the control signal R23ACB. Among the driving parts P1, N1, and N2, a first pull-down driving part N1 and a second pull-down driving part N2 may be configured by NMOS transistors, wherein the first pull-down driving part N1 may be pull-down driven in response to the bank selection signal BKSELP and the second pull-down driving part N2 may be pull-down driven in response to any one of a redundancy signal NXEB, a bank selection bar signal BKSELPB, and a row address decoding signal LAXDEB. The redundancy signal NXEB may be activated during a redundancy operation and the bank selection bar signal BKSELPB may be activated during an active operation. The bank selection signal BKSELP, the redundancy signal NXEB, the bank selection bar signal BKSELPB, and the row address decoding signal LAXDEB may be used to generate the block selection signal BSB.

The latch circuit 222_1 may latch an output signal outputted from a common node of the pull-up driving part P1 and the first pull-down driving part N1 and output the block selection signal BSB. The block selection signal BSB may control the word line deactivation signal WLOFF and the bit line level equalization signal BLEQ.

Figure 4:
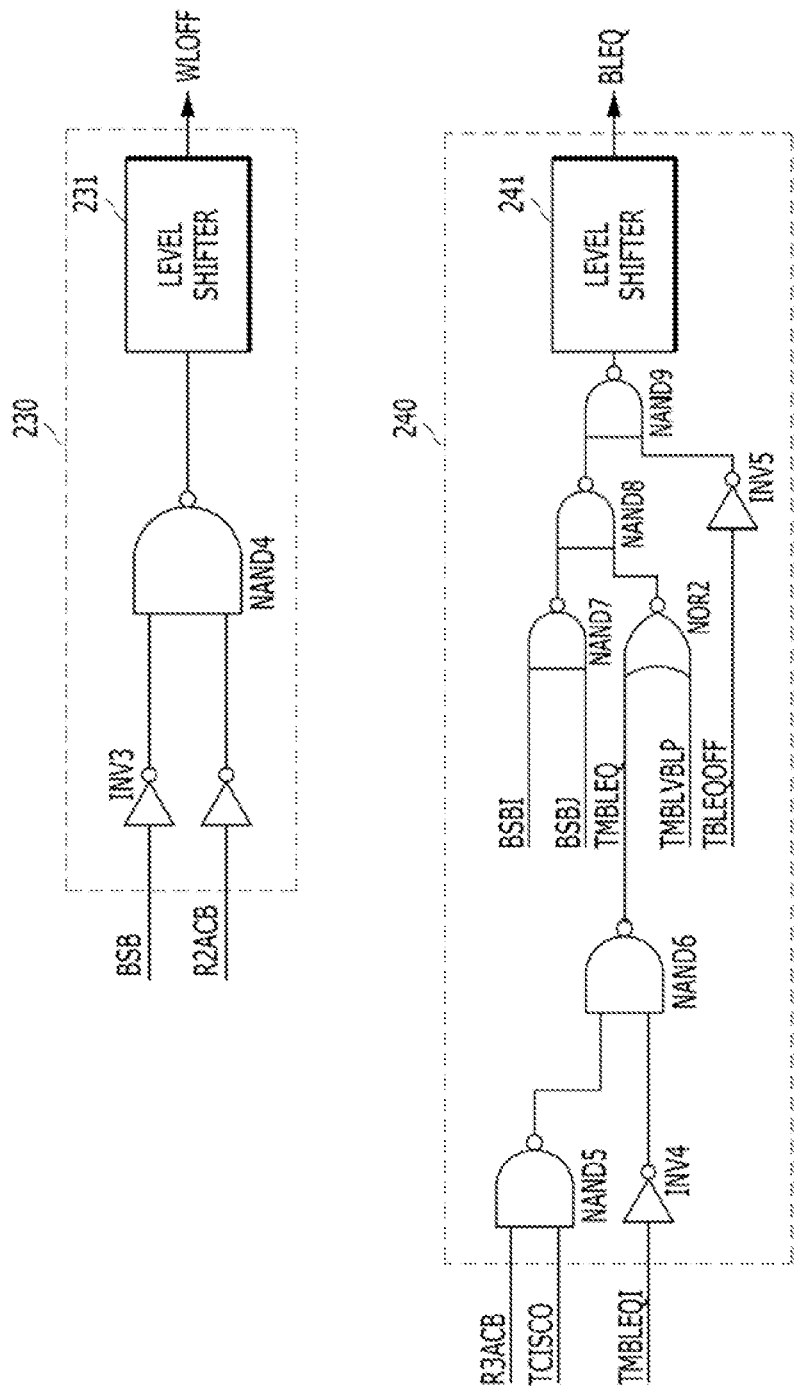
FIG. 4 is a circuit diagram illustrating a word line control unit and a bit line equalization control unit illustrated in FIG. 2.

FIG. 4 is a circuit diagram illustrating the word line control unit 230 and the bit line equalization control unit 240 illustrated in FIG. 2.

Referring to FIG. 2 to FIG. 4, the word line control unit 230 may include an inverter INV3, a NAND gate NAND4, and a level shifter 231. The inverter INV3 may invert the first precharge signal R2ACB. The NAND gate NAND4 may logically combine the block selection signal BSB with an output signal of the inverter INV4, and the level shifter 231 may shift a level of an output signal of the NAND gate NAND4, to a level suitable for disabling a word line, and output the word line deactivation signal WLOFF.

The bit line equalization control unit 240 may include a plurality of NAND gates NAND5 to NAND9, a plurality of inverters INV4 and INV5, a NOR gate NOR2, and a level shifter 241.

The second precharge signal R3ACB, the test signal TCISCO, and a bit line equalization control signal TMBLEQI may be logically combined with one another through the plurality of NAND gates NAND5 and NAND6 and the inverter INV4, and may be outputted as a bit line level equalization test signal TMBLEQ.

A plurality of block selection signals BSBI and BSBJ, the bit line level equalization test signal TMBLEQ, a bit line precharge voltage signal TMBLVBLP, and a bit line level equalization non-driving signal TBLEQOFF may be logically combined with one another through the plurality of NAND gates NAND7 to NAND9, the NOR gate NOR2, and the inverter INV5. The level shifter 241 may shift a level of an output signal of the NAND gate NAND9, to a level suitable for precharging a bit line, that is, to have a bit line precharge voltage, for example, VBLP=VCORE/2, and may output the bit line level equalization signal BLEQ.

The block selection signals BSBI and BSBJ, the bit line level equalization test signal TMBLEQ, the bit line precharge voltage signal TMBLVBLP, and the bit line level equalization non-driving signal TBLEQOFF may be internal control signals for generating the bit line level equalization signal BLEQ.

Figure 5:
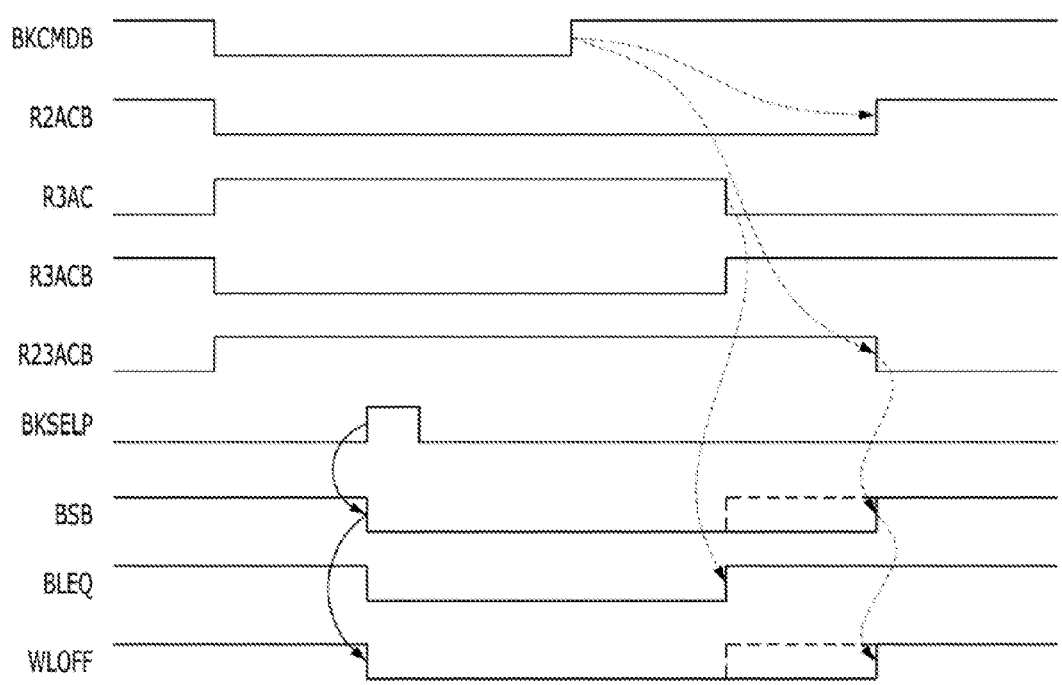
FIG. 5 is a timing diagram illustrating an operation of the semiconductor memory device illustrated in FIG. 2 to FIG. 4.

FIG. 5 is a timing diagram illustrating an operation of the semiconductor memory device of FIG. 2 to FIG. 4.

Referring to FIG. 2 to FIG. 5, an operation in which the semiconductor memory device performs the test operation in response to the test signal TCISCO will be described as an example.

The semiconductor memory device may delay the bank command signal BKCMDB by the first and second delay amounts through the first precharge signal generation section 211 and the second precharge signal generation section 212, thereby generating the first precharge signal R2ACB and the second precharge signal R3ACB. It can be understood that the first precharge signal R2ACB is further delayed as compared with the second precharge signal R3ACB.

The signal combination section 221 may logically combine the first precharge signal R2ACB with the second precharge signal R3ACB, thereby generating the control signal R23ACB whose activation duration includes the activation duration of the first precharge signal R2ACB and the activation duration of the second precharge signal R3ACB.

Then, the block selection signal generation section 222 may generate the block selection signal BSB in response to the control signal R23ACB and the bank selection signal BKSELP.

The word line control unit 230 may generate the word line deactivation signal WLOFF in response to the block selection signal BSB and the first precharge signal R2ACB, and the bit line equalization control unit 240 may generate the bit line level equalization signal BLEQ in response to the block selection signal BSB and the second precharge signal R3ACB.

In brief, the word line deactivation signal WLOFF may be activated in response to the control signal R23ACB generated from the first precharge signal R2ACB, and the bit line level equalization signal BLEQ may be activated in response to the second precharge signal R3ACB. Consequently, due to the control signal R23ACB, the word line deactivation signal WLOFF may be activated later than when the bit line level equalization signal BLEQ is activated, so that it is possible to check whether a data failure occurs because of the margin between the word line deactivation signal WLOFF and the bit line level equalization signal BLEQ, during a test operation. Such a test operation is repeatedly performed to sufficiently ensure the margin between the word line deactivation signal WLOFF and the bit line level equalization signal BLEQ, so that it is possible to prevent data failures from occurring.

For such an operation, the semiconductor memory device of the present invention may perform the test operation by the following method.

The semiconductor memory device may perform the test operation including a first test step of generating the block selection signal BSB in response to the first and second precharge signals R2ACB and R3ACB having different activation durations and the bank selection signal BKSELP, a second test step of generating the bit line level equalization signal BLEQ in response to the second precharge signal R3ACB and the block selection signal BSB, a third test step of generating the word line deactivation signal WLOFF in response to the first precharge signal R2ACB and the block selection signal BSB, a fourth test step of performing the precharge operation in response to the bit line level equalization signal BLEQ, and a fifth test step of repeating the first to fourth test steps until the bit line level equalization signal BLEQ is activated later than when the word line deactivation signal WLOFF is activated by adjusting the activation timing of the bit line level equalization signal BLEQ.

Figure 6:
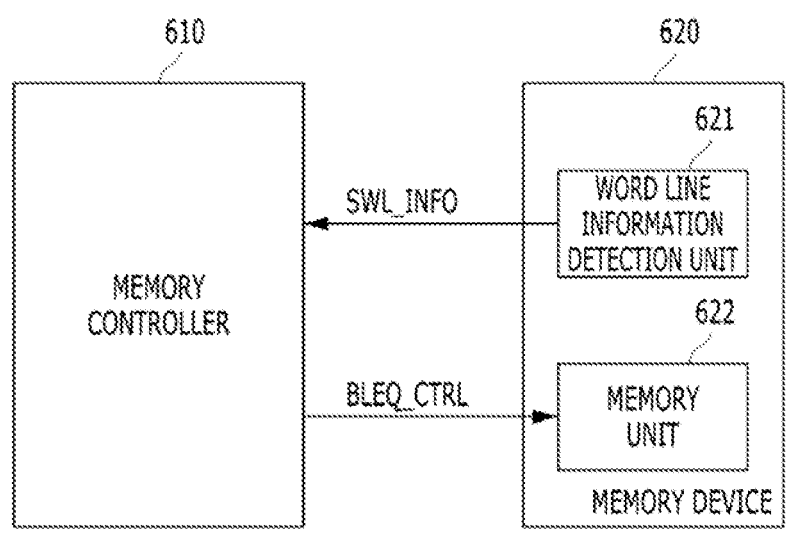
FIG. 6 is a block diagram illustrating a semiconductor system in accordance with an embodiment of the present invention.

FIG. 6 is a block diagram illustrating a semiconductor system in accordance with an embodiment of the present invention.

Referring to FIG. 6, the semiconductor system may include a memory controller 610 and a memory device 620.

The memory device 620 may include a word line information detection unit 621 and a memory unit 622.

The word line information detection unit 621 may detect degradation information SWL_INFO on a plurality of sub-word lines (not illustrated). The amount of degradation in each of the sub-word lines may be different, and the slope may be reduced depending on how degraded the bit lines have become. The degradation information SWL_INFO on the sub-word lines may be transferred to the memory controller 610.

The memory controller 610 may generate a bit line level equalization control signal BLEQ_CTRL corresponding to the most degraded word line based on the degradation information SWL_INFO on the sub-word lines. This is for allowing degraded sub-word lines to stably write and precharge data. The memory controller 610 may output the bit line level equalization control signal BLEQ_CTRL to the memory unit 622.

The memory unit 622 may internally generate a bit line level equalization signal BLEQ in response to the bit line level equalization control signal BLEQ_CTRL, thereby stably performing the precharge operation.

The memory unit 622 may include elements included in the semiconductor memory device illustrated in FIG. 2, except for the signal adjustment unit 260 of the semiconductor memory device illustrated in FIG. 2. The bit line level equalization control signal BLEQ_CTRL may correspond to the adjustment control signal CTRL of FIG. 2, be inputted to the second precharge signal generation section 212 of FIG. 2, and may be used to control the activation timing of the bit line level equalization signal BLEQ.

In brief, the memory controller 610 may generate the bit line level equalization control signal BLEQ_CTRL corresponding to the most degraded word line based on the degradation information SWL_INFO on the plurality of sub-word lines generated through the word line information detection unit 621, so that the memory unit 622 may protect data of the most degraded word line and stably perform a bit line precharge operation.

Figure 7:
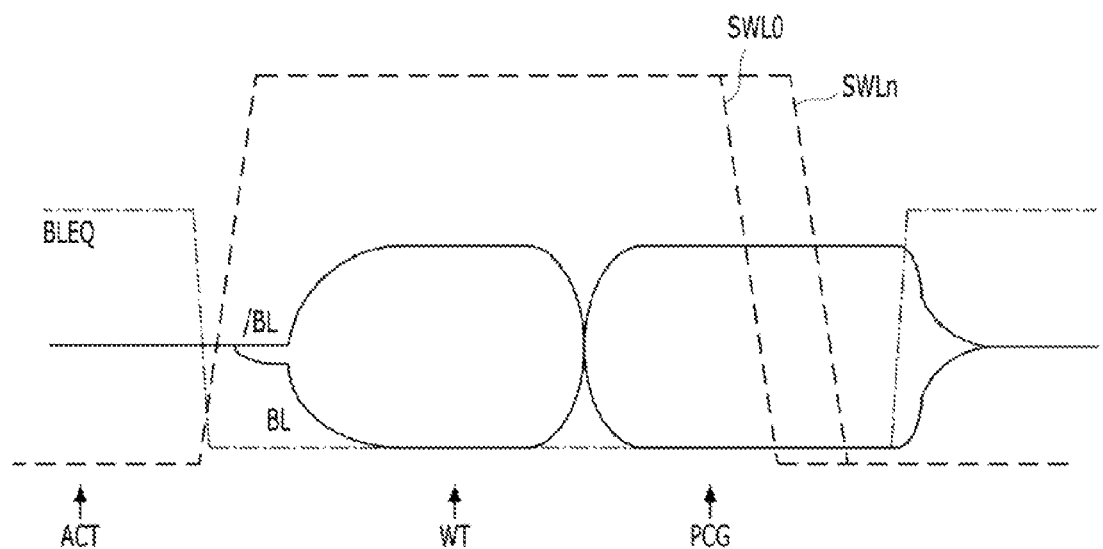
FIG. 7 is a waveform diagram illustrating an operation of a semiconductor memory device in accordance with an embodiment of the present invention.

FIG. 7 is a waveform diagram illustrating an operation of a semiconductor memory device in accordance with an embodiment of the present invention.

Referring to FIG. 7, a plurality of sub-word lines SWL0 to SWLn may be activated in response to an active command ACT, and then the write operation may be performed in response to a write command WT. After the write operation ends, the bit line level equalization signal BLEQ for precharging bit lines BL may be activated in response to a precharging command PCG. The bit line level equalization signal BLEQ may be activated after the most degraded second sub-word line SWLn of the sub-word lines SWL0 to SWLn is deactivated. Consequently, even though the amount of degradation of each of the sub-word lines SWL0 to SWLn is different, it is possible to stably protect data, and the precharge operation may also be stably performed. Accordingly, it is possible to prevent data failures from occurring.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
   a control signal generation unit configure to generate a block selection signal in response to first and second precharge signals during a test operation;
   a word line control unit configure to generate a word line deactivation signal in response to the first precharge signal and the block selection signal; and
   a bit line equalization control unit configure to generate a bit line level equalization signal in response to the second precharge signal and the block selection signal.

2. The semiconductor memory device of claim 1, wherein, during the test operation, the bit line level equalization signal is initially set to be activated earlier than when the word line deactivation signal is activated.

3. The semiconductor memory device of claim 1, wherein the control signal generation unit comprises:
   a signal combination section suitable for generating a control signal for controlling the block selection signal by combining the first precharge signal with the second precharge signal during the test operation; and
   a block selection signal generation section suitable for generating the block selection signal in response to the control signal and a bank selection signal.

4. The semiconductor memory device of claim 1, further comprising:
   a first precharge signal generation section suitable for generating the first precharge signal in response to a bank command signal and a first duration signal during the test operation; and
   a second precharge signal generation section suitable for generating the second precharge signal in response to the bank command signal and a second duration signal during the test operation.

5. The semiconductor memory device of claim 4, wherein the first duration signal indicates a minimum time required to write data in a memory cell coupled to a word line.

6. The semiconductor memory device of claim 4, wherein the second duration signal indicates a minimum time required to precharge a bit line.

7. The semiconductor memory device of claim 1, wherein an activation duration of the first precharge signal is longer than an activation duration of the second precharge signal.

8. The semiconductor memory device of claim 4, further comprising:
   a memory core unit suitable for performing a precharge operation in response to the bit line level equalization signal, and outputting data information on data pass/fail occurring in the precharge operation; and
   a signal adjustment unit suitable for generating an adjustment control signal based on the data information during the test operation,
   wherein the second precharge signal generation section adjusts an activation duration of the second precharge signal in response to the adjustment control signal.

9. The semiconductor memory device of claim 8, wherein the activation duration of the second precharge signal is adjusted until the bit line level equalization signal is activated later than when the word line deactivation signal is activated.

10. A semiconductor memory device comprising:
    a precharge signal generation unit configure to generate first and second precharge signals having different activation durations in response to a bank command signal;
    a control signal generation unit configure to generate a block selection signal in response to the first and second precharge signals during a test operation;
    a word line control unit configure to generate a word line deactivation signal in response to the first precharge signal and the block selection signal; and
    a bit line equalization control unit configure to generate a bit line level equalization signal in response to the second precharge signal and the block selection signal.

11. The semiconductor memory device of claim 10, wherein, during the test operation, the bit line level equalization signal is initially set to be activated earlier than when the word line deactivation signal is activated.

12. The semiconductor memory device of claim 10, wherein the control signal generation unit comprises:
    a signal combination section suitable for generating a control signal for controlling the block selection signal by combining the first precharge signal with the second precharge signal during the test operation; and
    a block selection signal generation section suitable for generating the block selection signal in response to the control signal and a bank selection signal.

13. The semiconductor memory device of claim 10, wherein the precharge signal generation unit comprises:
    a first precharge signal generation section suitable for generating the first precharge signal in response to the bank command signal and a first duration signal during the test operation; and
    a second precharge signal generation section suitable for generating the second precharge signal in response to the bank command signal and a second duration signal during the test operation.

14. The semiconductor memory device of claim 13, wherein the first duration signal indicates a minimum time required to write data in a memory cell coupled to a word line.

15. The semiconductor memory device of claim 13, wherein the second duration signal indicates a minimum time required to precharge a bit line.

16. The semiconductor memory device of claim 10, wherein the activation duration of the first precharge signal is longer than the activation duration of the second precharge signal.

17. The semiconductor memory device of claim 10, further comprising:
   a memory core unit suitable for performing a precharge operation in response to the bit line level equalization signal, and outputting data information on data pass/fail occurring in the precharge operation; and
   a signal adjustment unit suitable for generating an adjustment control signal based on the data information during the test operation,
   wherein the precharge signal generation unit adjusts the activation duration of the second precharge signal in response to the adjustment control signal.

18. The semiconductor memory device of claim 17, wherein the activation duration of the second precharge signal is adjusted until the bit line level equalization signal is activated later than when the word line deactivation signal is activated.

19. A test method of a semiconductor memory device, the test method comprising:
   generating a block selection signal in response to first and second precharge signals that have different activation durations and a bank selection signal;
   generating a bit line level equalization signal in response to the second precharge signal and the block selection signal;
   generating a word line deactivation signal in response to the first precharge signal and the block selection signal;
   performing a precharge operation in response to the bit line level equalization signal; and
   repeating the generating of the block selection signal, the generating of the bit line level equalization signal, the generating of the word line deactivation signal, and the performing of the precharge operation until the bit line level equalization signal is activated later than when the word line deactivation signal is activated by adjusting when the bit line level equalization signal is activated.

* * * * *